United States Patent
Beauvais et al.

[11] Patent Number: 5,918,143
[45] Date of Patent: Jun. 29, 1999

[54] FABRICATION OF SUB-MICRON SILICIDE STRUCTURES ON SILICON USING RESISTLESS ELECTRON BEAM LITHOGRAPHY

[75] Inventors: Jacques Beauvais, Sherbrooke; Dominique Drouin, Deauville; Éric Lavallée, Sherbrooke, all of Canada

[73] Assignee: Universite de Sherbrooke, Sherbrooke, Canada

[21] Appl. No.: 08/821,651

[22] Filed: Mar. 20, 1997

[30] Foreign Application Priority Data

Feb. 12, 1997 [CA] Canada ................................ 2197400

[51] Int. Cl.$^6$ .................................................. H01L 21/44
[52] U.S. Cl. ............................ 438/607; 438/660; 438/682
[58] Field of Search ................................. 438/607, 660, 438/682

[56] References Cited

U.S. PATENT DOCUMENTS

| | | | |
|---|---|---|---|
| 4,093,503 | 6/1978 | Harris et al. | 156/628 |
| 4,214,966 | 7/1980 | Mahoney | 204/192 E |
| 4,256,514 | 3/1981 | Pogge | 148/1.5 |
| 4,402,128 | 9/1983 | Blackstone | 29/591 |
| 4,496,419 | 1/1985 | Nulman et al. | 156/643 |
| 4,569,124 | 2/1986 | Rensch et al. | 29/591 |
| 4,772,539 | 9/1988 | Gillespie | 430/296 |
| 4,804,438 | 2/1989 | Rhodes | 156/653 |
| 4,997,809 | 3/1991 | Gupta | 505/1 |
| 5,075,243 | 12/1991 | Nieh et al. | 437/40 |
| 5,315,130 | 5/1994 | Hively et al. | 257/48 |
| 5,444,007 | 8/1995 | Tsuchiaki | 437/35 |
| 5,478,698 | 12/1995 | Rostoker et al. | 430/296 |

OTHER PUBLICATIONS

"Growth rates for Pt$_2$Si and PtSi formation under UHV and controlled impurity atmospheres" C.A. Crider, J.M. Poate, Appl. Phys. Lett. 36(60), Mar. 15, 1980, pp. 417–419.

"Ambient effects on the diffusion of Cr and Si in thin Pt films" Chin–An Chang, W.–K. Chu Appl. Phys. Lett. 37)2), Jul. 15, 1980, pp. 161–162.

"Sub–20–nm–wide metal lines by electron–beam exposure of thin poly(methylmethacrylate) films and liftoff" S.P. Beaumont et al. Appl. Phys. Lett. 38(6), Mar. 15, 1981, pp. 436–439.

"Dynamics of the Si–Pt Reaction Under Pulsed Heat Flow" E. D'Anna et al. Thin Solid Films, 129 (1985) pp. 93–102.

(List continued on next page.)

Primary Examiner—John F. Niebling
Assistant Examiner—Michael S. Lebentritt
Attorney, Agent, or Firm—Goudreau Gage Dubuc & Martineau Walker

[57] ABSTRACT

A method for fabricating a sub-micron structure of etch-resistant metal/semiconductor compound on a substrate of semiconductor material comprises the step of depositing onto the substrate a layer of metal capable of reacting with the semiconductor material to form etch-resistant metal/semiconductor compound, and the step of producing a focused electron beam. The focused electron beam is applied to the layer of metal to locally heat the metal and semiconductor material and cause diffusion of the metal and semiconductor material in each other to form etch-resistant metal/semiconductor compound. The focused electron beam is displaced onto the layer of metal to form the structure of etch-resistant metal/semiconductor compound. Finally, the layer of metal is wet etched to leave on the substrate only the structure of metal/semiconductor compound. Following wet etching of the layer of metal, an oxygen plasma etch can be conducted to remove a carbon deposit formed at the surface of the structure of etch-resistant metal/semiconductor compound. Also, the substrate may be subsequently etched to remove a thin layer of metal rich semiconductor material formed at the surface of the substrate by reaction, at room temperature, of the metal and semiconductor material with each other.

21 Claims, 2 Drawing Sheets

OTHER PUBLICATIONS

"PtSi contact metallurgy: Effect of silicide formation process" Chin–An Chang, J. Appl. Phys. 58(8) Oct. 15, 1985, pp. 3258–3261.

"PtSi contact metallurgy formed by three–temperature annealing sequences and short annealing time" Chin–An Chang et al. J. Appl. Phys. 61(1), Jan. 1, 1987, pp. 201–205.

"Effect of conventional and rapid thermal annealing on platinum silicide Schottky barrier diodes" C.A. Dimitriadis, Appl. Phys. Lett. 56(2), Jan. 8, 1990, pp. 143–145.

"Determination of the Diffusing Species and Diffusion Mechanism during CoSi, NiSi, and PtSi Formation by Using Radioactive Silicon as a Tracer" R. Pretorius et al. J. Electroch. vol. 136, No. 3 Mar. 1989, pp. 839–842.

Low–temperature reaction of thin–film platinum (<300 Å) with (100) silicon Bing–Uue Tsui et al. J. Appl. Phys 68(12) Dec. 15, 1990, pp. 6246–6252.

"Fabrication of sub–10 nm structures by lift–off and by etching after electron–beam exposure of poly(methylmethacrylate) resist on solid substrates" W. Chen et al. J.Vac.Sci.Technol. B 11(6) 1993, pp. 2519–2523.

"Resist heating effect in electron beam lithography" M. Yasuda et al. J.Vac. Sci. Technol. B 12(3), 1994 pp. 1362–1366.

"Initial stages in the formation of PtSi on Si(111) as followed by photoemission and spectroscopic ellipsometry" L. Ley et al. Thin Solid Films 270 (1995) pp. 561–566.

"New process for the controlled formation of ultra–thin PtSi films for infrared detector applications" A. Torres et al., SPIE, vol. 2554, 1995, pp. 185–190.

"Sub–10 nm lithography and development properties of inorganic resist by scanning electron beam" J. Fujita et al., Appl. Phys. Lett. 66(22), May 29, 1995, pp. 3065–3067.

"Activation energy for $Pt_2Si$ and PtSi formation measured over a wide range of ramp rates" E.G. Colgan, J. Mater. Res. vol. 10, No. 8, Aug. 1995, pp. 1953–1957.

"Lithography using electron beam induced etching of a carbon film" D. Wang et al., J. Vac. Sci. Technol. B 13(5), Sep./Oct. 1995, pp. 1984–1987.

"Scanning probe anodization: Patterning of hydrogen–terminated silocon surfaces for the nanofabrication of gold structures by electroless plating" Sugimura et al., J.Vac.Techn.B 13(5) 1995, pp. 1933–1937.

FABRICATION OF SUB-MICRON SILICIDE STRUCTURES ON SILICON USING RESISTLESS ELECTRON BEAM LITHOGRAPHY

BACKGROUND OF THE INVENTION

1. Field of the Invention

The present invention relates to a method for fabricating a structure of etch-resistant metal/semiconductor compound on a substrate of semiconductor material using resistless electron beam lithography, more specifically a highly focused electron beam to produce a sub-micron structure of etch-resistant metal/semiconductor compound.

2. Brief Description of the Prior Art

The fabrication of ultra-small scale electronic devices requires efficient high resolution lithography techniques. Resist-based lithography processes are very frequently involved in these high resolution lithography techniques, and poly(methyl methacrylate) (PMMA) is the polymer most widely used as a resist for electron beam lithography applications (S. P. Beaumont, P. G. Bower, T. Tamamura, C. D. W. Wilkinson, *Appl. Phys. Lett.*, 38, 438 (1991) and W. Chen, H. Ohmed, *J. Vac. Sci. Technol.*, B 11, 2519 (1993)).

These types of lithographic processes suffer from several limitations which can become extremely constraining in the fabrication of sub-100 nm devices. These limitations include undesirable proximity effects in the resist and resolution limits imposed by the size of the polymer molecules. Proximity effects are produced when the exposed patterns are situated within the range of backscattered electrons. These electrons are primary electrons which collide with the substrate with a great angle to escape from the surface with a high energy in an area which may be considerably larger than the electron beam diameter. These high energy electrons expose the resist in an undesirable region. Current research efforts in lithography techniques include several resistless processes for defining patterns (see for example D. Wang, P. C. Hoyle, J. R. A. Cleaver, G. A. Porkolab, N. C. MacDonald, *J. Vac. Sci. Technol.*, B 13, 1984 (1995) for electron beams; and H. Sugimura and N. Nakagiri, *J. Vac. Sci. Technol*, B 13, 1933 (1995) for a scanning probe technique).

The formation of a silicide layer is usually carried out by annealing samples of thin metal layers on silicon substrates in a conventional furnace with a controlled atmosphere of $N_2$-$H_2$. This annealing technique requires several minutes to convert the metal film into silicide (see C. A. Chang, *J. Appl. Phys.*, 58, 3258 (1985); C. A. Chang and A. Segmuller, *J. Appl. Phys.*, 61, 201 (1987); C. A. Chang and W. K. Chu, *Appl. Phys. Lett.*, 37, 3258 (1980); and C. A. Chang and J. M. Poate, *Appl. Phys. Lett.*, 36, 417 (1980)).

New techniques involving Rapid Thermal Annealing (RTA) improve the process of the formation of silicide. RTA silicide films are significantly better than those formed by conventional annealing (C. A. Dimitriadis, *Appl. Phys. Lett.*, 56, 143 (1990)), due to a shorter processing time (A. Torres, S. Kolodinski, R. A. Donaton, K. Roussel and H. Bender, *SPIE*, 2554, 185, (1995)).

More recently, several techniques of formation of silicide have been developed. These processes involve heating of metal-silicon interfaces using photons, electrons and ion beams (J. M. Poate and J. W. Mayer, *Laser Annealing of Semiconductors*, Academic Press, New York, 1982; J. Narayan, W. L. Brown and R. A. Lemons, *Laser-Solids Interactions and Transient Processing of Materials*, North- Holland, New York, 1983; and E. D'Anna, G. Leggieri and A. Luches, *Thin Solids Films*, 129, 93 (1985)). All these methods are based on the concept of forming silicide with localized heating near the surface. However, none of these techniques is intended as lithography processes, the heating occurring over the entire surface of the sample.

OBJECTS OF THE INVENTION

An object of the present invention is therefore to overcome the above described drawbacks of the prior art.

Another object of the invention is to provide a method involving a direct write resistless lithography technique to produce a structure of etch-resistant metal/semiconductor compound on a substrate of semiconductor material with achievable linewidths below 50 nm.

SUMMARY OF THE INVENTION

Generally, the present invention relates to a method for fabricating a structure of etch-resistant metal/semiconductor compound on a substrate of semiconductor material, comprising the steps of depositing onto the substrate a layer of metal capable of reacting with the semiconductor material to form etch-resistant metal/semiconductor compound, producing a focused electron beam, applying the focused electron beam to the layer of metal to locally heat the metal and semiconductor material and cause diffusion of the metal and semiconductor material in each other to form etch-resistant metal/semiconductor compound, displacing the focused electron beam onto the layer of metal to form the structure of etch-resistant metal/semiconductor compound, and wet etching the layer of metal to leave on the substrate of semiconductor material only the structure of etch-resistant metal/semiconductor compound.

The use of a focused electron beam in a resistless lithography process enables the production of a structure of etch-resistant metal/semiconductor compound having linewidths as thin as 50 nm.

The semiconductor material may be selected from the group consisting of silicon and gallium arsenide, and the metal may be selected from the group consisting of cobalt, chrome, hafnium, iridium, manganese, nickel, palladium, platinum, rhodium, tantalum, titanium, tungsten, zirconium.

Preferably, each portion of the structure of etch-resistant metal/semiconductor compound is exposed to the focused electron beam a plurality of times to achieve finer linewidths.

The present invention is also concerned with a method for fabricating a silicide structure on a silicon substrate, comprising the steps of depositing onto the silicon substrate a layer of metal capable of reacting with silicon to form silicide, producing a focused electron beam, applying the focused electron beam to the layer of metal to locally heat the metal and silicon and cause diffusion of the metal and silicon in each other to form silicide, displacing the focused electron beam onto the layer of metal to form a silicide structure, and wet etching the layer of metal to leave on the silicon substrate only the silicide structure.

The metal may be selected from the group consisting of cobalt, chrome, hafnium, iridium, manganese, nickel, palladium, platinum, rhodium, tantalum, titanium, tungsten, zirconium.

Following the step of wet etching the layer of metal, an oxygen plasma etch can be conducted to remove a carbon deposit formed at the surface of the silicide structure. After the step of wet etching the layer of metal, the silicon substrate may also be wet etched to remove a thin layer of metal rich silicon formed at the surface of the silicon substrate by reaction, at room temperature, of the metal and silicon with each other.

The objects, advantages and other features of the present invention will become more apparent upon reading of the following non restrictive description of preferred embodiments thereof, given by way of example only with reference to the accompanying drawings.

DETAILED DESCRIPTION OF THE PREFERRED EMBODIMENTS

Figure 1A:
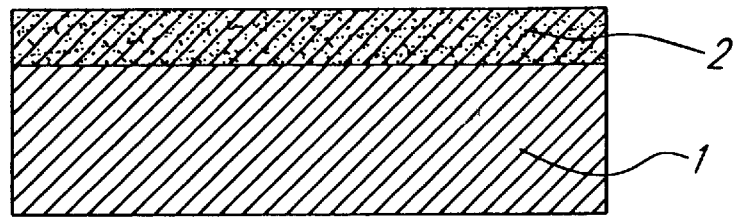
FIG. 1a is a side elevational view of a silicon substrate on which a layer or film of metal has been deposited.

In the different figures of the appended drawings, the corresponding elements are identified by the same reference numerals.

Appended FIGS. 1a, 1b, 1c and 1d illustrate various steps of a preferred embodiment of the method according to the present invention, for fabricating a structure 3 of silicide on a silicon substrate 1. This method uses a controlled and focused electron beam 4 (FIG. 1b) to anneal the silicon substrate 1 and a layer or film of metal 2 deposited on the substrate 1.

Figure 1B:
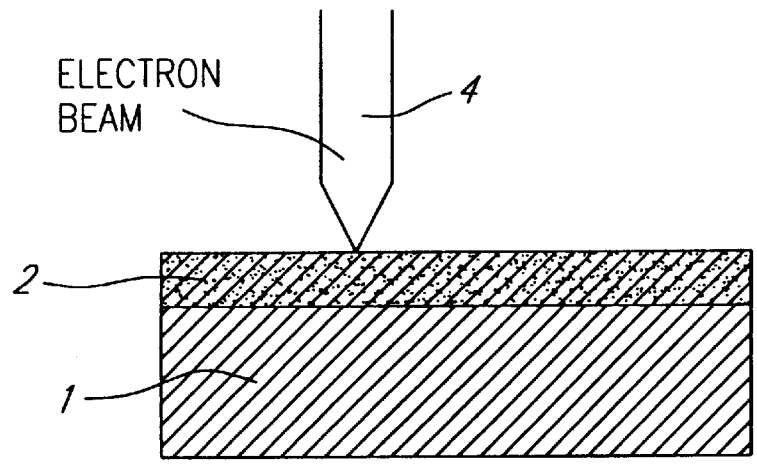
FIG. 1b is a side elevational view of the silicon substrate and layer of metal of FIG. 1a, showing annealing of the silicon substrate and layer of metal by means of a controlled and focused electron beam.
Figure 1C:
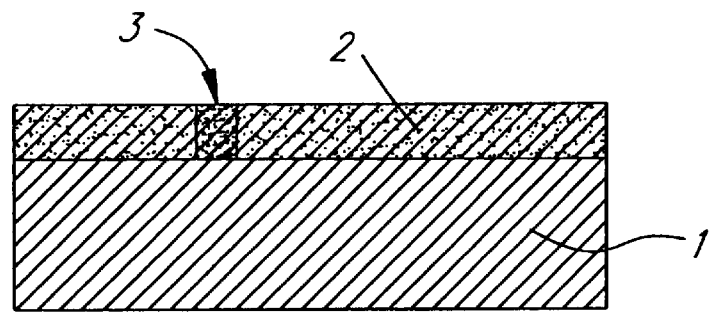
FIG. 1c is a side elevational view of the silicon substrate and layer of metal of FIG. 1a, showing a silicide structure that has been formed on the silicon substrate.
Figure 1D:
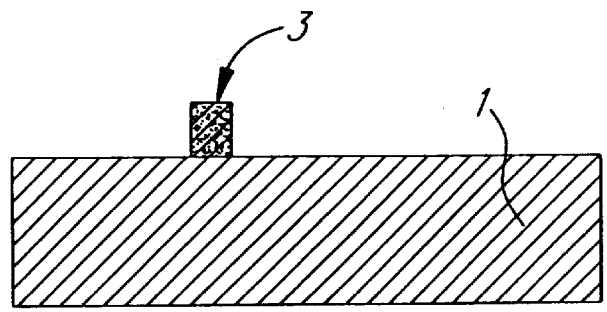
FIG. 1d is a side elevational view of the silicon substrate and layer of metal of FIG. 1a, in which the non reacted portion of the layer of metal has been wet etched to leave on the silicon substrate only the silicide structure.

More specifically, the preferred embodiment of the method according to the invention, for fabricating a silicide structure 3, formed for example of ultra-narrow lines of conductive silicide, onto the silicon substrate 1 can be summarized as follows:

FIG. 1a: a layer of metal 2 capable of reacting with silicon to form silicide is deposited on the previously cleaned silicon substrate 1 using for example an electron beam evaporation technique or cool sputtering in a low vacuum chamber (see FIG. 1a);

FIG. 1b: the layer of metal 2 and the silicon substrate 1 are annealed by applying the focused electron beam 4 to the layer of metal 2 to locally heat the metal and silicon and cause diffusion of the metal and silicon in each other to form silicide. It has been demonstrated (M. Yasuda, H. Kawata, K. Murata, K. Hashimoto, Y. Hirai and N. Nomura, *J. Cac. Sci. Technol.*, B12, 1362 (1994)) that temperatures greater than 400° C. can be obtained with a focused electron beam, such as the one produced in a Scanning Electron Microscope (SEM). The temperature required to form silicide of several metals varies from 200–700° C. (S. M. Sze, Physics of Semiconductor Devices $2^{nd}$ Edition, Wiley, New York (1990)). The electron beam is controlled, for example computer-controlled, to produce current density higher than 100 mA/cm$^2$ so as to increase locally the temperature to a few hundred degrees Celsius. The electron beam is also displaced, for example under the control of a computer, to expose a desired pattern to be given to the silicide structure (see FIG. 1b);

FIG. 1c: the area exposed to the focused electron beam has been transformed into a silicide structure 3 due to the above mentioned diffusion of the metal and silicon in each other; and FIG. 1d: the sample of FIG. 1c is immersed into an acid solution that is able to etch the metal film 2 but not the silicide structure 3. Usually, an aqua regia solution ($H_2O:HCl:HNO_3=8:7:1$) is a proper acid to perform this task. After this wet etch, only the area (silicide structure) having been exposed to the electron beam will remain on the substrate.

Exposure to the electron beam 4 may deposit some carbon at the surface of the silicide structure 3, which carbon may be removed through an oxygen plasma etch. During the evaporation process, the metal of the layer 2 may react at room temperature with the silicon of the substrate 1 to form a thin layer (not shown) of metal rich silicon. This undesirable layer can be removed by a wet etching of the silicon. A standard chemical etch such as $H_2O:HNO_3:HF=50:49:1$ can be used for that purpose.

EXAMPLE

In this example, the method in accordance with the present invention will be applied to the production of a platinum silicide.

The activation energy to first form $Pt_2Si$ is around 1.4 eV and the temperature range is situated between 200–350° C. The growth of PtSi takes place only when all the Pt is transformed into $Pt_2Si$, the activation energy in this case is increased to 1.6 eV and the range of temperature formation is 300–450° C. (E. G. Colgan, *J. Mater Res.*, 10, 1953 (1995)). Thus it is possible to form patterned platinum silicide structures, that is carrying out the method of the invention using a standard SEM system.

Platinum layers of several thicknesses (20 nm to 100 nm) were evaporated onto clean n-type high resistivity silicon <100> substrates using an electron gun deposition system with an evaporation rate of 0.5 nm/s. To carry out the present invention into practice, a electron beam lithography system consisting of a JEOL JSM-6300 Scanning Electron Microscope (SEM) equipped with a tungsten filament and a beam blanker and controlled with the NPGS (Nanometer Pattern Generation System ver. 7.5, by J. C. Nabity Lithography Systems) lithography software. A SEM produces a highly focused electron beam suitable to produce sub-micron silicide structures. Exposures were carried out at several low energies (1 keV to 5 keV) and the unexposed platinum was removed from the silicon surface using an aqua regia solution of $H_2O:HCl:HNO_3=8:7:1$. An etch time of 4 minutes at 80° C. was used. The difference in etch rates for the unexposed Pt and the silicide was sufficient to obtain a selective etch. However, prolonged etching can remove the silicide structure.

Figure 2A:
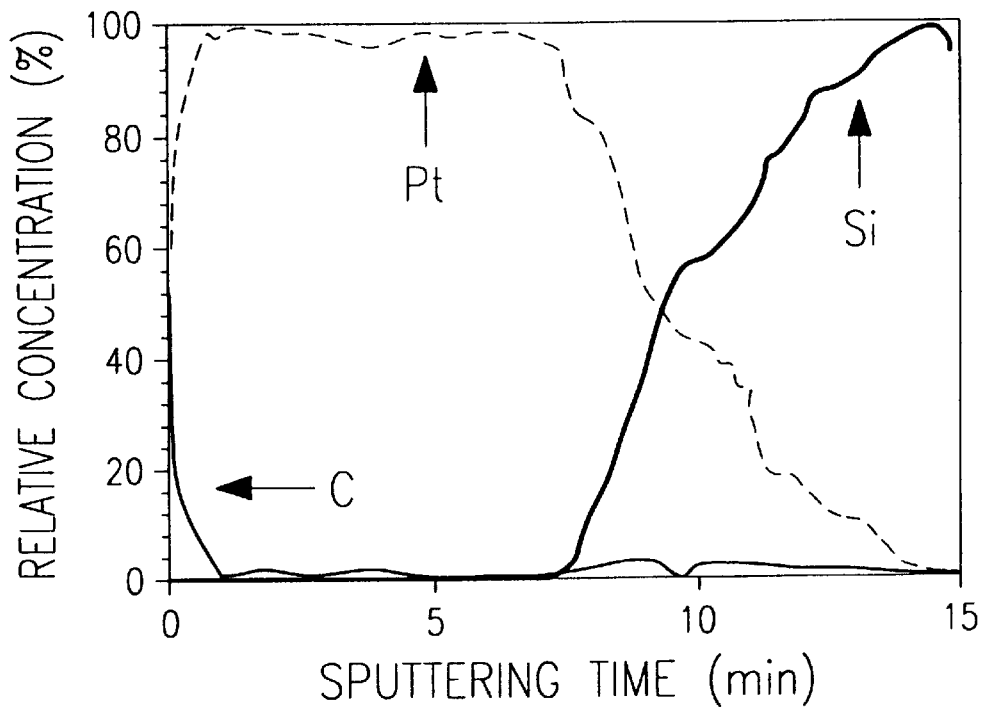
FIG. 2a is a graph showing an Auger Electron Spectroscopy (AES) depth profile of a layer or film of platinum (Pt) deposited onto a silicon substrate.
Figure 2B:
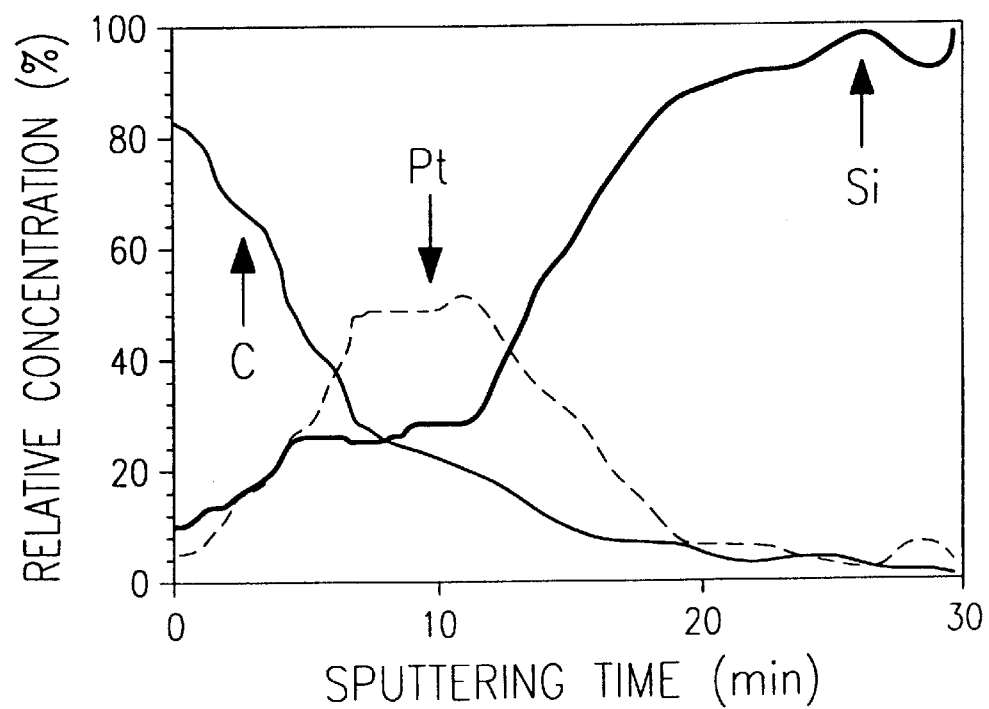
FIG. 2b is a graph showing an AES depth profile of a layer or film of platinum (Pt) deposited onto a silicon substrate, after an annealing treatment using an electron beam.

FIG. 2a shows an Auger Electron Spectroscopy (AES) depth profile of a 50 nm Pt thin film as deposited. As expected a smooth transition from the deposited layer to the substrate can be observed. In FIG. 2b, the analysed sample consists of a 20 μm×20 μm structure exposed with the electron beam. The line dose used to produce the square was 17 μC/cm. The surface of the platinum silicide is contaminated with carbon which originates from the SEM chamber. A plateau can be observed corresponding to a $Pt_2Si$ region. From this spectrum it is clear that the heating effect of the focused electron beam is sufficient to enable the diffusion of silicon through the metal layer (R. Pretaurius, M. A. E. Wandt and J. E. McLoed, J. Electrochem. Soc., 136, 839 (1989)) and form platinum silicide which has a smaller etch rate than pure Pt. This difference in etch rates provides a means to pattern the metal layer with sub-micron resolution.

The formation of the silicide depends on several factors. The thickness of the deposited layer determines the values of the accelerating voltage of the electron beam. Better results have been observed when the maximum dissipated energy of the electrons occurs in the metal layer near the junction with silicon. Another important factor that determines the temperature rise is the current density. Experiments have been carried out with a tungsten filament and the current density is approximately 100 mA/cm$^2$ for a 1 keV electron beam (J. I. Goldstein, D. E. Newbury, P. Echlin, D. C. Joy, A. D. Romig Jr., C. E. Lyman, C. Fiori, E. Lifshin, Scanning Electron Microscopy and X-Ray Microanalysis, Second Edition, Plenum Press, New York, 1994, pp 820). This value decreases slightly for currents lower that 100 pA. Also, the current density increases with the electron beam energy, due to the smaller probe size. The higher the current density the higher is the heat obtained at the interface Pt-Si. The last parameter that determines the formation of the silicide is the electron beam exposure time or the line dose. A threshold line dose is required to form the silicide; when the exposed time is lower than the threshold value, the pattern will not resist the wet etching.

As an example to form fine structures using 20 nm of Pt evaporated on a silicon substrate, a 3 keV electron beam would be adequate. In fact, linewidths less than 50 nm have been obtained using a 100 pA electron beam (≈200 mA/cm$^2$), 1.5 μC/cm dose. In this case, to reduce the carbon contamination and the local charging effects, the complete dose was achieved by multiple exposition (J. Fujita, H. Watanabe, Y. Ochiai, S. Manako, J. S. Tsai and S. Matsui, Appl. Phys. Lett., 66, 3065 (1995)). More specifically, each segment of the microstructure has been exposed 20 times using a reduced line dose of 0.075 μC/cm. The effect of carbon contamination is to absorb some of the electron energy, thus reducing the amount of energy lost in the metal layer and decreasing the temperature rise. This technique of multiple exposition reduces the total line dose required for threshold, by reducing the rate of carbon deposition. Multiple repetition also significantly decreases the linewidth at threshold. For a given line dose, multiple repetition implies a series of shorter exposure times for the pattern. In this case, the temperature required for silicide formation may only be attained in the center of the beam due to its Gaussian profile, thus creating the suicide in a region which is narrower than the beam diameter.

After the wet etch, the unexposed area may be contaminated with Pt. In fact, the first few nanometers of Pt evaporated can react with silicon at room temperature to form a silicide of about 2 nm in thickness (L. Ley, Y. Wang, V. Nhuyen Van, S. Fisson, D. Soche, G. Vuye and J. Rivory, Thin solids film, 270, 561 (1995)), thereby decreasing the surface resistivity of the silicon. The surface resistivity was restored to its original value by using a second wet etch conducted during 6 minutes in $H_2O:HNO_3:HF=50:49:1$.

Also, to remove the surface carbon contamination due to prolonged beam exposure in the SEM chamber, the surface of the silicide structure can be exposed to an oxygen plasma etch for 20 minutes.

Proximity effects are reduced dramatically with the method according to the invention. In fact, with this method, proximity effects have been observed only within the range of the electron beam diameter. Accordingly, by using a high performance SEM, the beam diameter will be reduced and the current density will be increased. Finer structure with relatively insignificant proximity effects will then be achievable using an even smaller line dose.

A second important point to note is that no lift-off is required here as in the case of resist based processes. Such lift-off processes can significantly reduce resolution and reduce the yield.

A novel resistless fabrication method to produce sub-50 nm metallic lines for use as thin conducting structures or even as etching masks on silicon substrates has been disclosed. This method should reduce the proximity effects present in resist-based lithography and provide a resolution limit superior to the 50 nm linewidth obtained using a tungsten filament SEM.

Although the present invention has been described hereinabove with reference to a preferred embodiment thereof, this embodiment can be modified at will, within the scope of the appended claims, without departing from the spirit and nature of the subject invention. As non limitative examples:

semiconductor materials, other than silicon (Si), such as gallium arsenide (GaAs) could be used;
  with a substrate of silicon (Si), the metal can be selected from the group consisting of: cobalt (Co), chrome (Cr), hafnium (Hf), iridium (Ir), manganese (Mn), nickel (Ni), palladium (Pd), platinum (Pt), rhodium (Rh), tantalum (Ta), titanium (Ti), tungsten (W), zirconium (Zr);
  with a substrate of gallium arsenide (GaAs), at least platinum (Pt) could be used as metal.

What is claimed is:

1. A method for fabricating a silicide structure on a silicon substrate, comprising the steps of:
  depositing onto the silicon substrate a layer of metal capable of reacting with said silicon to form silicide;
  producing a focused electron beam;
  applying the focused electron beam to the layer of metal to locally heat said metal and silicon and cause diffusion of said metal and silicon in each other to form silicide;
  displacing the focused electron beam onto the layer of metal to form the silicide structure; and
  wet etching the layer of metal to leave on the silicon substrate only the silicide structure and wherein said producing step comprises producing a focused electron beam having a current density higher than 100 mA/cm$^2$.

2. A method for fabricating a silicide structure on a silicon substrate as recited in claim 1, in which said metal is selected from the group consisting of: cobalt, chrome, hafnium, iridium, manganese, nickel, palladium, platinum, rhodium, tantalum, titanium, tungsten, zirconium.

3. A method for fabricating a silicide structure on a silicon substrate as recited in claim 1, in which said applying step comprises locally heating said metal and silicon to a temperature situated between 200° C. and 700° C.

4. A method for fabricating a silicide structure on a silicon substrate as recited in claim 1, further comprising, after said step of wet etching the layer of metal, the step of conducting an oxygen plasma etch to remove a carbon deposit formed at the surface of the silicide structure.

5. A method for fabricating a silicide structure on a silicon substrate as recited in claim 1, further comprising, after said step of wet etching the layer of metal, the step of wet etching the silicon substrate to remove a thin layer of metal rich silicon formed at the surface of the silicon substrate by reaction, at room temperature, of said metal and silicon with each other.

6. A method for fabricating a silicide structure on a silicon substrate as recited in claim 1, wherein said metal comprises platinum, and wherein said applying step comprises locally heating the platinum and silicon to a temperature situated between 200° C. and 350° C. to form platinum silicide.

7. A method for fabricating a silicide structure on a silicon substrate as recited in claim 6, further comprising the step of growing the platinum silicide by heating said platinum silicide to a temperature situated between 300° C. and 450° C.

8. A method for fabricating a silicide structure on a silicon substrate as recited in claim 1, wherein said metal comprises platinum, and wherein the layer of platinum has a thickness situated between 20 nm and 100 nm, and the silicon substrate is an n-type high resistivity silicon <100> substrate.

9. A method for fabricating a silicide structure on a silicon substrate as recited in claim 8, wherein said wet etching step is conducted during 4 minutes in a dilute aqua regia solution of $H_2O:HCl:HNO_3=8:7:1$.

10. A method for fabricating a silicide structure on a silicon substrate as recited in claim 1, in which said displacing step comprises exposing each portion of the silicide structure to the focused electron beam a plurality of times.

11. A method for fabricating a silicide structure on a silicon substrate as recited in claim 1, wherein said metal comprises platinum, and said method further comprises, after said step of wet etching the layer of platinum, the step of wet etching the silicon substrate to remove a thin layer of platinum rich silicon having formed at the surface of the silicon substrate by reaction, at room temperature, of said platinum and silicon with each other.

12. A method for fabricating a silicide structure on a silicon substrate as recited in claim 11, in which the thin layer of platinum rich silicon comprises a silicide of about 2 nm thick, and said step of wet etching the silicon substrate is conducted during 6 minutes in $H_2O:HNO_3:HF=50:49:1$.

13. A method for fabricating a silicide structure on a silicon substrate as recited in claim 1, wherein said metal comprises platinum, and said method further comprises, after said step of wet etching the layer of platinum, the step of conducting an oxygen plasma etch during 20 minutes to remove a carbon deposit formed at the surface of the silicide structure.

14. A method for fabricating a structure of etch-resistant metal/semiconductor compound on a substrate of semiconductor material, comprising the steps of:

depositing onto the substrate a layer of metal capable of reacting with said semiconductor material to form etch-resistant metal/semiconductor compound;

producing a focused electron beam;

applying the focused electron beam to the layer of metal to locally heat said metal and semiconductor material and cause diffusion of said metal and semiconductor material in each other to form etch-resistant metal/semiconductor compound;

displacing the focused electron beam onto the layer of metal to form the structure of etch-resistant metal/semiconductor compound; and wet etching the layer of metal to leave on the silicon substrate only the structure of etch-resistant metal/semiconductor compound and wherein said producing step comprises producing a focused electron beam having a current density higher than 100 $mA/cm^2$.

15. A method for fabricating a structure of etch-resistant metal/semiconductor compound on a substrate of semiconductor material as recited in claim 14, in which said semiconductor material is selected from the group consisting of silicon and gallium arsenide.

16. A method for fabricating a structure of etch-resistant metal/semiconductor compound on a substrate of semiconductor material as recited in claim 15, wherein said metal is selected from the group consisting of: cobalt, chrome, hafnium, iridium, manganese, nickel, palladium, platinum, rhodium, tantalum, titanium, tungsten, zirconium.

17. A method for fabricating a structure of etch-resistant metal/semiconductor compound on a substrate of semiconductor material as recited in claim 14, wherein:

said producing step comprises producing a highly focused electron beam; and said displacing step comprises displacing the highly focused electron beam onto the layer of metal to form a sub-micron structure of etch-resistant metal/semiconductor compound.

18. A method for fabricating a structure of etch-resistant metal/semiconductor compound on a substrate of semiconductor material as recited in claim 14, in which said displacing step comprises computer-controlling displacement of the electron beam on the layer of metal to form a patterned structure of etch-resistant metal/semiconductor structure.

19. A method for fabricating a structure of etch-resistant metal/semiconductor compound on a substrate of semiconductor material as recited in claim 14, further comprising, after said step of wet etching the layer of metal, the step of conducting an oxygen plasma etch to remove a carbon deposit formed at the surface of the structure of etch-resistant metal/semiconductor compound.

20. A method for fabricating a structure of etch-resistant metal/semiconductor compound on a substrate of semiconductor material as recited in claim 1, further comprising, after said step of wet etching the layer of metal, the step of wet etching the substrate of semiconductor material to remove a thin layer of metal rich semiconductor material formed at the surface of the substrate by reaction, at room temperature, of said metal and semiconductor material with each other.

21. A method for fabricating a structure of etch-resistant metal/semiconductor compound on a substrate of semiconductor material as recited in claim 14, in which said displacing step comprises exposing each portion of the structure of etch-resistant metal/semiconductor compound to the focused electron beam a plurality of times.

* * * * *